US007086017B1

(12) United States Patent
Bloom

(10) Patent No.: US 7,086,017 B1
(45) Date of Patent: Aug. 1, 2006

(54) METHOD OF POST-IMPLEMENTATION SIMULATION OF A HDL DESIGN

(75) Inventor: Andrew M. Bloom, Boulder, CO (US)

(73) Assignee: Xilinx, Inc., San Jose, CA (US)

( * ) Notice: Subject to any disclaimer, the term of this patent is extended or adjusted under 35 U.S.C. 154(b) by 675 days.

(21) Appl. No.: 10/166,970

(22) Filed: Jun. 10, 2002

(51) Int. Cl.
*G06F 17/50* (2006.01)

(52) U.S. Cl. .............................. 716/4; 716/3; 717/127; 703/14

(58) Field of Classification Search ................ 717/127, 717/136; 716/18, 3, 4, 6, 5; 703/14
See application file for complete search history.

(56) References Cited

U.S. PATENT DOCUMENTS

| | | | | |
|---|---|---|---|---|
| 5,991,523 | A * | 11/1999 | Williams et al. ............... | 716/18 |
| 6,247,165 | B1 * | 6/2001 | Wohl et al. ..................... | 716/5 |
| 6,530,073 | B1 * | 3/2003 | Morgan ......................... | 716/18 |
| 6,539,531 | B1 * | 3/2003 | Miller et al. ................... | 716/15 |
| 6,581,191 | B1 * | 6/2003 | Schubert et al. ............... | 716/4 |
| 6,629,312 | B1 * | 9/2003 | Gupta ......................... | 717/136 |
| 6,779,158 | B1 * | 8/2004 | Whitaker et al. ............... | 716/3 |
| 6,904,577 | B1 * | 6/2005 | Schubert et al. ............... | 716/4 |
| 2001/0000427 | A1 * | 4/2001 | Miller ......................... | 333/33 |
| 2002/0129341 | A1 * | 9/2002 | Hibdon ......................... | 717/136 |
| 2002/0162086 | A1 * | 10/2002 | Morgan ....................... | 716/18 |
| 2003/0125925 | A1 * | 7/2003 | Walther et al. ............... | 703/22 |
| 2004/0015900 | A1 * | 1/2004 | Kawakatsu ................. | 717/140 |

OTHER PUBLICATIONS

Bartley, Mike G; Galpin, Daren; Blackmore, Tim; A Comparison of Three Verification Techniques: Testing, Pseudo-Random Testing and Property Checking:, p. 819-823, DAC Jun. 2002, retrieved from ACM Portal Jun. 12, 2005.*

(Continued)

*Primary Examiner*—Wei Zhen
*Assistant Examiner*—Mary Steelman
(74) *Attorney, Agent, or Firm*—William L. Zitelli; Robert Brush

(57) ABSTRACT

A method of post-implementation simulation of a hardware description language (HDL) net list file, that does not match a HDL design file from which it was synthesized, comprises the steps of: creating a remap file which translates ports between the HDL net list file and the HDL design file; and simulating the HDL net list file utilizing the remap file and a (HDL) test bench file created for pre-implementation simulation of the HDL design file. The method may be executed in an integrated software environment or a batch software environment.

20 Claims, 3 Drawing Sheets

OTHER PUBLICATIONS

Hajjar, Amjad; Chen, Tom; Munn, Isabelle; Andrews, Anneliese; Bjorkman, Maria; "High Quality Behavioral Verification Using Statistical Stopping Criteria", p. 411-418, 2001 IEEE, retrieved Jun. 12, 2005.*

Novakovsky, Sasha; Shyman; Shy; Hanna, Ziyad; "High Capacity and Automatic Functional Extraction Tool for Industrial VLSI Circuit Designs", p. 520-525, retrieved Jun. 12, 2005.*

Pisini, VK; Tahar, S; Curzon, P; Ait-Mohamed, O; Song, X; "Formal Hardware Verification by Integrating HOL and MDG", ACM 2000, retrieved Jun. 12, 2005.*

Xilinx, Inc.; HDL Bencher User's Guide, Copyright 1999-2000; available from Xilinx, Inc., 2100 Logic Drive, San Jose, California 95124; pp. 1-47.

U.S. Appl. No. 10/046,870, filed Jan. 15, 2002, Bloom et al.

* cited by examiner

METHOD OF POST-IMPLEMENTATION SIMULATION OF A HDL DESIGN

FIELD OF THE INVENTION

The present invention is directed to methods of post-implementation simulation of hardware description language (HDL) designs, in general, and more particularly, to a method of post-implementation simulation of a HDL net list file, that does not match a HDL design file from which it was synthesized, utilizing a HDL test bench file created for pre-implementation simulation of the HDL design and a remap file.

BACKGROUND OF THE INVENTION

The term "programmable gate array" or "PGA" as used in the instant application is intended to cover all integrated circuits which incorporate a digital design, like logic arrays, application specific integrated circuits (ASICs), custom designs and the like. In order to program a digital design into a PGA, the design is first described through an English like textual programming language known as hardware design source language or HDL. There are many different HDLs on the market, like Verilog and VHDL, for example. Once the design is written in HDL and before the PGA is programmed (i.e. pre-implementation), a behavioral HDL design file or program is created and tested by computer simulation to verify that the design functions as intended. To test the HDL design, a HDL test bench file or program (or test fixture) is written which, when executed, applies stimulus to the design, then verifies the expected response via computer pre-implementation simulation. Once the HDL design has been verified at the pre-implementation stage, it is then synthesized to create a HDL net list file which is post-implementation computer simulated to verify that the timing of the implemented design meets the user's goals, and that the HDL design was implemented correctly. If the test bench file does not simulate with the post-synthesis net list file, the test bench file is updated by hand re-coding until it can simulate with the synthesized net list file.

Currently, most hardware designers develop test bench files for the behavioral HDL designs by hand. They computer simulate the HDL design with the corresponding test bench file or files to make sure the behavioral HDL design functions as intended. Next, the HDL design is implemented via synthesis, and the resulting post-implementation net list file is exported which includes a functional design description and timing information. The user then attempts to computer simulate this net list file with the original behavioral test bench file. In many instances there is no problem.

However, in a number of circumstances, the net list file does not match with the behavioral HDL design and thus, can not be computer simulated with the original test bench file without suitable modification. The net list file may not simulate because the original HDL design is changed during synthesis as a result of the transformations that occur, thus, making the resulting net list file incompatible with the original test bench file. Such transformations include data type remapping (for example, in VHDL, integers and signed/unsigned vectors are remapped to std_logic_vector), signal additions (such as global reset lines), signal elimination (such as inputs optimized out) and the like. Therefore, in these instances, the designer will modify the behavioral test bench file to simulate with the implemented net list. The modifications may include updating all assignments, ports, assertions, and related code—and can involve a great deal of labor-intensive hand re-coding depending on the complexity of the design, the data types used, and the implementation results. Additionally, these modifications need to be made for all test bench files associated with the HDL design file (large designs may have dozens, or even hundreds of test bench files), and such test bench files need to be continually updated as design changes are made to the original HDL design in order to computer simulate the modified design at the post-implementation stage.

The present invention intends to overcome the aforementioned drawbacks of the post-implementation methods of computer simulation of a HDL design by reducing substantially the labor-intensive re-coding activity involved in updating the original test bench files of a HDL design file.

SUMMARY OF THE INVENTION

In accordance with one aspect of the present invention, a method of post-implementation simulation of a HDL net list file, that does not match a HDL design file from which it was synthesized, utilizing a (HDL) test bench file created for pre-implementation simulation of the HDL design file, comprises the steps of: creating a remap file which translates ports between the HDL net list file and the HDL design file; and simulating the HDL net list file utilizing the HDL test bench file and remap file.

In accordance with another aspect of the present invention, a method of post-implementation simulation of a HDL net list file comprises executing the following steps in an integrated software environment: building the HDL net list file from a HDL design file; creating a remap file which translates ports between the HDL net list file and the HDL design file; and simulating the HDL net list file utilizing a (HDL) test bench file created for pre-implementation simulation of the HDL design file and the remap file.

In accordance with yet another aspect of the present invention, a method of post-implementation simulation of a HDL net list file comprises executing the following steps in a batch software environment: building the HDL net list file from a HDL design file; creating a remap file which translates ports between the HDL net list file and the HDL design file; and simulating the HDL net list file utilizing a (HDL) test bench file created for pre-implementation simulation of the HDL design file and the remap file.

DETAILED DESCRIPTION OF THE DRAWINGS

An embodiment of the present invention may be operative in an integrated software environment (ISE), like the Project Navigator™ Software Product marketed by Xilinx, for example, which may be executed in a computer on an operating system platform like Windows® marketed by Microsoft corporation, for example. However, it is understood that other ISEs and/or operating system platforms may be used just as well or the embodiment be operated within the user's script files in a batch software environment, i.e. when using the Xilinx Synthesis Technology (XST) tool or a third party synthesis tool, without deviating from the broad principles of the present invention. Information on the Project Navigator Product and XST tool has been published by Xilinx, Inc.

In the present example, a HDL design may have been previously created and stored in the ISE under a pre-specified Project or PGA for which the design is intended. With this embodiment, the user has the ability of choosing or selecting the Project and the HDL source program or file of the design for testing and verification. One or more original HDL test bench files may be created using waveforms of stimuli and expected response or behavior of the HDL design through use of a graphical user interface (GUI) program of a test bench creation program, like the HDL Bencher® software product marketed by Xilinx, for example, which is launched by the ISE upon selection by the user. The created HDL test bench files may be also stored in the ISE for future retrieval as will become more apparent from the description herein below. For a more detailed description of HDL Bencher, reference is made to the "HDL Bencher User's Guide", published by Xilinx (2000).

Figure 1:
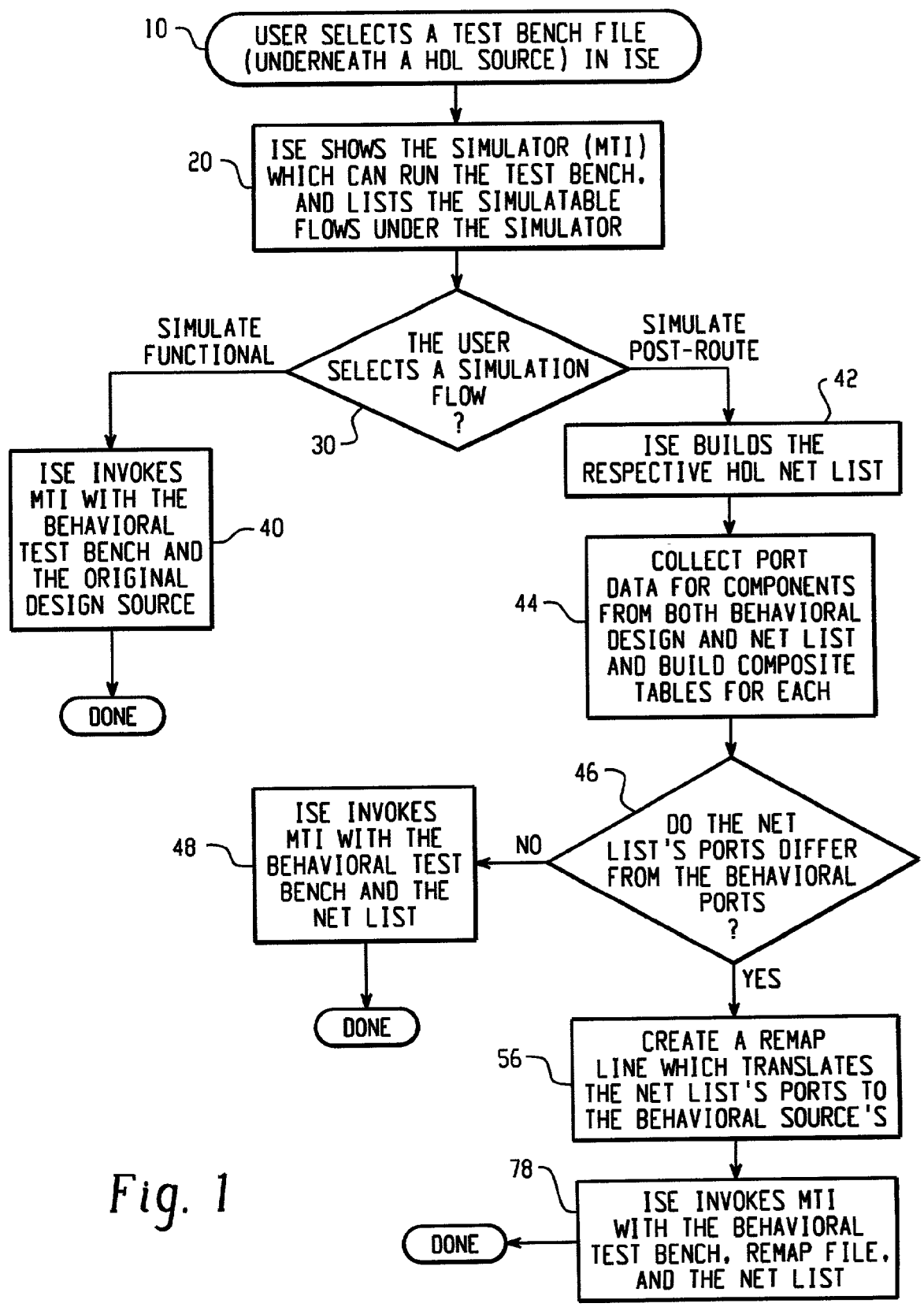
FIG. 1 is an exemplary process flow chart suitable for embodying the present invention for use in an integrated software environment.

An embodiment of the present invention for use in an ISE is illustrated by the exemplary process flow chart of FIG. 1. In this embodiment, an HDL design file and one or more original HDL test bench files have been created and stored in the ISE as described herein above. Referring to FIG. 1, in step or block 10, the user may select the HDL design file and corresponding test bench file via the screen display and GUI of the ISE, for example. Next, in step 20, the ISE may show the type of simulator program which can computer simulate the test bench file and list the possible simulatable flows in a pull down menu of the screen display, for example. A simulator program suitable for use in the ISE comprises ModelSim™(MTI) which was created and marketed by Mentor Graphics. In step 30, the user may select the desired simulatable flow by moving the cursor to the desired flow in the pull down menu and double clicking thereon with a mouse device, for example.

If the selected flow is to computer simulate the HDL design functionally (i.e. pre-implementation), the method continues at step 40 in which the ISE invokes the MTI simulation program utilizing the original HDL design and HDL test bench therefor. Pre-implementation computer simulation is performed at step 40 and the ISE verifies the original HDL design and completes the process flow. On the other hand, if in step 30, the selected flow is to post-implementation simulate the HDL design, then the method continues at step 42 in which the ISE synthesizes the HDL design file to build the respective HDL net list and store it in the ISE. Now, the ISE has both the HDL design file and corresponding HDL net list file stored in a memory thereof.

Next, in step 44, the ISE collects port data for the components from each of the HDL design file and corresponding HDL net list file and builds a corresponding table for each. Each table comprises a composite of all of the ports (for each component) and includes certain port identifiers, such as the port names, the type information (original design or net list), and flags storing for presence in which source (original design or net list), for example.

Figure 2:
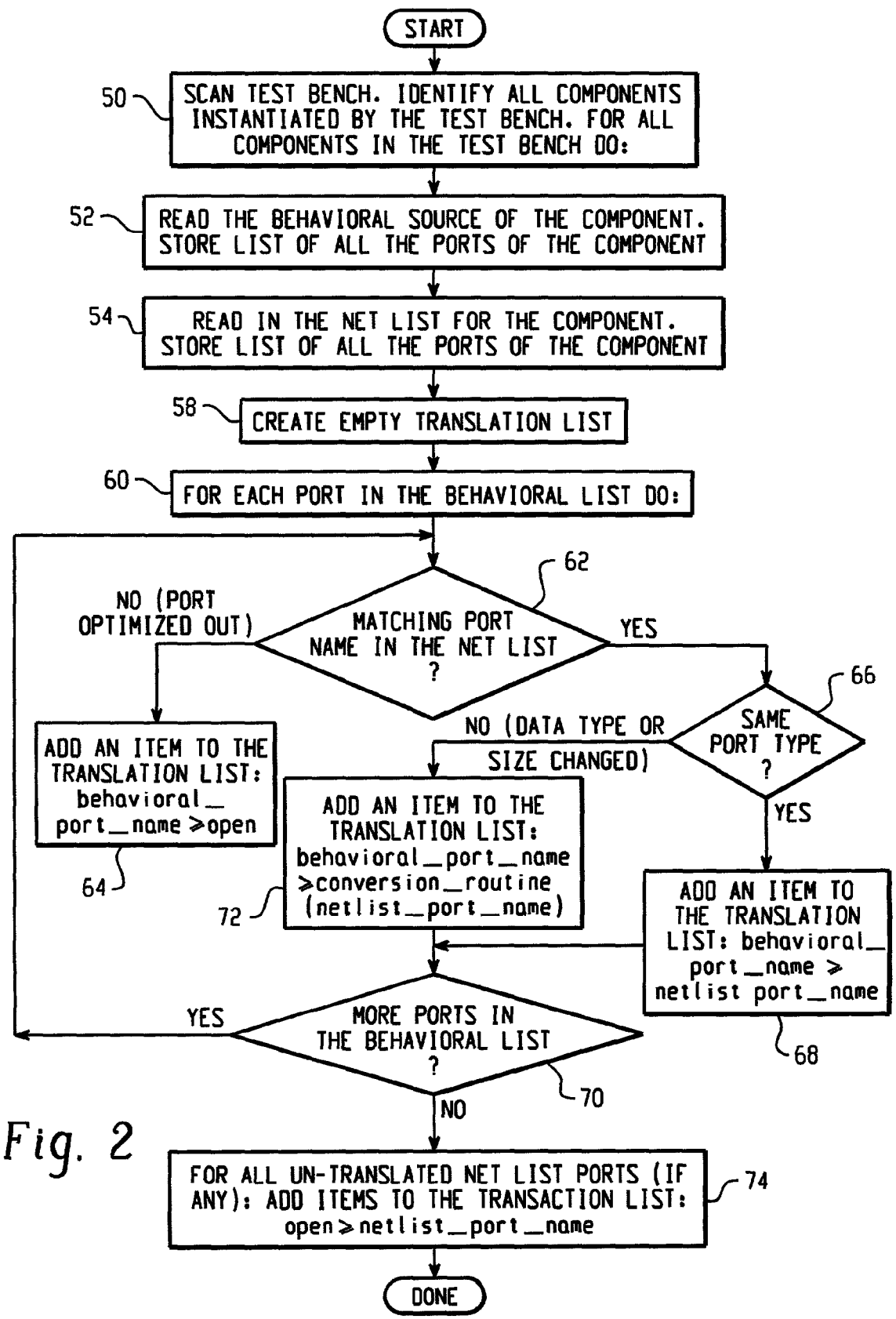
FIG. 2 is an exemplary process flow chart for collecting port data, building tables and creating a remap file suitable for use in an embodiment of the invention.

A suitable program embodiment for collecting the port data and building the tables is shown by the exemplary process flow chart of FIG. 2. In describing the program of FIG. 2, the HDL design file and synthesized net list file will be referred to as the behavioral file and net list file, respectively. Referring to FIG. 2, in step 50, the original HDL test bench file is scanned to identify all components instantiated thereby and for each identified component the following steps are performed. In step 52, the behavioral file of each identified component is read and a list of all of the ports and port identifiers of each component is stored in a first or behavioral table. Then, in step 54, the net list file of each identified component is read and a list of all of the ports and port identifiers of each component is stored in a second or net list table.

Referring back to the process flow of FIG. 1, after the first and second tables are built, the method continues at step 46 in which the ports listed in the net list table are compared to the ports listed in the behavioral table to determine if there are any unmatched ports. If it is determined that there are no unmatched ports between the two tables, then in step 48, the ISE invokes the simulation program for post-implementation simulation utilizing the HDL net list file and the original HDL test bench file used for pre-implementation simulation.

If it is determined in step 46 that the HDL net list file is not matched to the HDL design file, i.e. there are unmatched ports, then the method continues at step 56. In step 56, a remap file or translation list is created which translates ports between the HDL design file and the HDL net list file. In one embodiment, the remap file translates ports of the HDL net list file to ports of the HDL design file. A process flow exemplifying this embodiment is also shown in FIG. 2.

Referring to FIG. 2, in step 58, an empty remap file or translation list is created. Next, in step 60, the following steps, starting at step 62, are performed for each port listed in the behavioral file table. In step 62, it is determined if the port name of the first port of the behavioral file table is matched to the port name of a port of the net list table. The name matching process may include rules used by synthesis for renaming if the rules for the synthesis tool are known. These rules may be included in the present method directly or as an external rule file to be read and used by the present method in the translation process. Common synthesis renaming rules include renaming a signal name by appending a constant to it if the signal name matches a component instatiated by synthesis that is found in the libraries referenced by the synthesis tool (i.e. toc=>toc1). If there is no name match, the port is considered optimized out, and the method continues at step 64 in which text or a routing is created in the remap file to associate a port which is present in the behavioral file table but not present in the net list table as unconnected, open or defaulted, e.g. behavioral_port_name=>open.

If there is a name match in step 62, the method continues at step 66 in which it is determined if the matched ports are of the same type. If so, the ports are considered identical and text or a routing is created in the remap file which associates the ports directly in step 68, e.g. behavioral_port_name=>netlist_port_name. The method then continues at step 70 to determine if there are more ports on the list of the behavioral table and if so, step 62 is repeated for the next port on the list.

If the ports are determined not to be of the same type in step 66, i.e. of a different data type or the size has changed, the method continues at step 72 in which text or a routing is created in the remap file to associate the ports via a conversion routine, e.g. behavioral_port_name=>conversion routine (netlist_port_name). Then, the method continues at step 70. When there are no more ports on the list of the behavioral file table, the method determines if there are any untranslated ports in the list of ports of the net list table in step 74. Also, in step 74, for all ports that are present in the net list table but not in the behavioral table, text or a routing is created in the remap file to leave such ports open, e.g. open=>netlist_port_name.

These signals or ports that are present in the net list table but not in the behavioral table, which may be global reset signals or GSRs, for example, are newly introduced by the synthesis process and need to be handled differently during post-implementation simulation. For example, when such a port is addressed automatically by the simulation program, all other signals may be held constant for a period of time while the GSR signal is pulsed, then the other signals are returned to the normal simulation processing.

Returning to FIG. 1, once step 56 is completed and the remap file created, the ISE next invokes the simulation program or MTI in step 78 to perform the simulation of the HDL net list file utilizing the originally created HDL test bench file and the newly created remap file.

Figure 3:
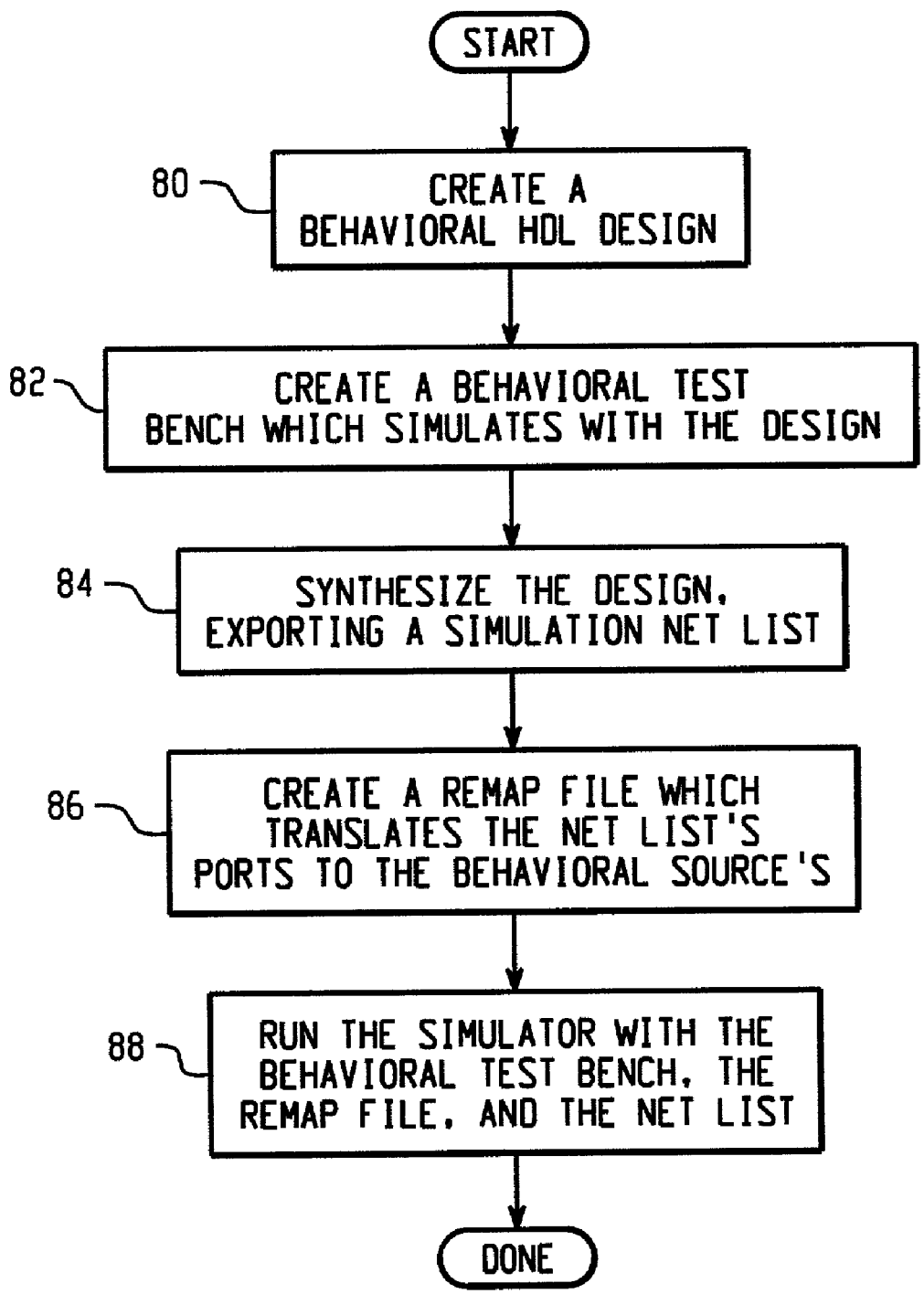
FIG. 3 is an exemplary process flow chart suitable for embodying the present invention for use in a batch software environment.

Alternatively, the present method may be embodied within a script file in a batch software environment. Figure 3 illustrates a process flow chart of a method embodiment suitable for use in a batch software environment. One difference between the automated flow in an ISE as described herein above in connection with the process flow chart of FIG. 1 and a scripted flow as shown in FIG. 3 is that the user would run the original design and the net list through the present method, and check the return value of the present method to determine if a remap file is to be created. Referring to FIG. 3, a behavioral HDL design file is created in step 80 and a HDL test bench file is created in step 82 for the pre-implementation simulation of the HDL design.

Next, in step 84, the HDL design file is synthesized to create and export a HDL net list file for the post-implementation simulation. The user may then run the design file and net list file through the present method, and check the return code from the present method to determine if a remap file is to be created. If the aforementioned files are determined to be unmatched, then a remap file is created in step 86 using the same or similar steps as that described for the method embodiment of FIG. 2. Then, in step 88, the simulator program is run for post-implementation simulation of the HDL net list file utilizing the originally created test bench file and the remap file.

In a more specific example of the present embodiment, a behavioral HDL design file (a counter) and the behavioral HDL test bench file is updated via the method to simulate with the post-implemented HDL net list. In this example, the behavioral HDL design file is of a counter (behavioral.vhd) coded in VHDL, which includes a reset line, clock, and the count out (integer data type in the behavioral source—translated to std_logic_vector by synthesis), and an input port, which will be optimized out by synthesis. The associated files (or portions thereof) are shown herein below. The final HDL design file is then simulated post-implementation using the original behavioral HDL test bench file substantially as the simulation source.

1. Example of behavioral.vhd:
entity COUNTER is
port (CLK, RESET, OPT:in bit;
COUNT:inout integer range 0 to 7);
end;
architecture arch of COUNTER is
begin process (CLK, RESET)
begin if RESET='1' then COUNT<=0;
elsif    CLK'EVENT    and    CLK='1'    then
  COUNT<=COUNT+1;
end if;
end process;
end;

2. Example of the associated test bench file (testbench.vhd)coded in VHDL:
ENTITY testbench IS
END testbench;
ARCHITECTURE arch OF testbench IS
COMPONENT COUNTER
PORT (
CLK, RESET, OPT:in bit;
COUNT:inout INTEGER
END COMPONENT;
SIGNAL CLK, RESET,OPT:bit;
SIGNAL COUNT:INTEGER;
BEGIN
UUT:COUNTER PORT MAP (
CLK=>CLK,
RESET=>RESET,
OPT=>OPT,
COUNT=>COUNT);
PROCESS BEGIN
CLOCK_LOOP:for I in 0 to 8 LOOP
IF I=0 then RESET<='1'; else RESET<='0'; end if;
CLK<='0';
WAIT FOR 10 ns;
CLK<='1';
WAIT FOR 10 ns;
assert (I=COUNT) report "Error at time(" & time'image (now) & ") count=" & integer'image(count) & "expected" integer'image(I) severity note;
END LOOP;
report "DONE" severity failure;
END PROCESS;
END);

3. The HDL design file behavioral.vhd is synthesized to a net list file synth.vhd with the following port definition:
entity COUNTER is
  port (CLK, RESET:in std_logic;
  COUNT:out std_logic_vector(0 to 2));
  end;

The synthesized port definition above is then compared with the behavioral port definition (reproduced below for easier reading):
entity COUNTER is
port (CLK, RESET, OPT:in bit;
COUNT:inout integer range 0 to 7);
end;

From the comparison, many changes in the port definitions are noted:
a) the input signal OPT was dropped by synthesis (it is not needed, and was optimized out);
b) the port type changed for the remaining inputs (CLK, RESET) from bit to std_logic;
c) the port type changed for COUNT from integer to std_logic vector; and
d) the port mode for COUNT changed from inout to out.

The changed port definitions make it impossible to simulate the HDL net list with the original behavioral test bench file without modification of some form.

4. The user runs a command line version of the method feeding it the behavioral testbench (testbench.vhd) and the netlist file (synth.vhd), choosing the remapped output to be called remap.vhd, and the revised testbench to be called remap_tb.vhd as shown by way of example below:
testbench=testbench.vhd
netlist=synth.vhd
output=remap.vhd
revised_testbench=remap_tb.vhd 5. The method then generates the output file (remap.vhd) which translates the netlist's ports to the behavioral ports as shown by way of example below:
ENTITY REMAP_COUNTER IS
PORT (—same port definition as
behavioral design
CLK, RESET, OPT:in bit;
COUNT:inout INTEGER
);
END;
ARCHITECTURE arch OF REMAP_COUNTER IS
COMPONENT COUNTER—netlist source
PORT (
   CLK, RESET:in std_logic;
   COUNT:out std_logic_vector(0 to 2)
);
END COMPONENT;
SIGNAL NETLIST_CLK, NETLIST_RESET,NETLIST_OPT std_logic;
SIGNAL NETLIST_COUNT:std_logic_vector(0 to 2);
BEGIN
UUT:COUNTER PORT MAP (
CLK=>NETLIST_CLK,
RESET=>NETLIST_RESET,
OPT=>NETLIST_OPT,
COUNT=>NETLIST_COUNT);
  PROCESS (NETLIST_CLK, NETLIST_RESET, NETLIST_OPT, NETLIST_COUNT) BEGIN
   IF NETLIST_CLK='O' THEN CLK <='0'; else CLK <='1';
   END IF;—conversion routine
   IF NETLIST_RESET='O' THEN RESET <='0'; else RESET<='1'; END IF;
   OPT=>'0';—This signal was optimized out of the netlist
   COUNT<=CONV_INTEGER(NETLIST_COUNT);— conversion routine
   END PROCESS;
END;

6. The method also generates the revised testbench file (remap_tb.vhd) shown by way of example below. This file contains the original test bench file with one revision; the component being instantiated is changed to the component of the remap file.
ENTITY testbench IS
END;
ARCHITECTURE arch OF testbench IS
COMPONENT REMAP_COUNTER—component changed to that of the remap file
PORT (
CLK, RESET, OPT:in bit;
COUNT:inout INTEGER
);
END COMPONENT;
SIGNAL CLK, RESET,OPT:bit;
SIGNAL COUNT INTEGER;
BEGIN
UUT:REMAP_COUNTER PORT MAP (—the remapped component is instantiated
CLK=>CLK,
RESET=>RESET,
OPT=>OPT,
COUNT=>COUNT);
PROCESS BEGIN
CLOCK_LOOP:for 1 in 0 to 8 LOOP
IF I=0 then RESET<='1'; else RESET<='0'; end if;
CLK <='0';
WAIT FOR 10 ns;
CLK<='1';
WAIT FOR 10 ns;
assert (I=COUNT) report "Error at time(" & time'image (now) & ") count=" & integer'image(count) & expected "integer" image(I) severity note;
END LOOP;
report "DONE" severity failure;
END PROCESS;
END;

7. According to the method, the user may now run his simulator program (e.g. MTI), using the remap file as shown by way of example below:
vlib work
vcom synth.vhd
vcom remap.vhd
vcom remap_tb.vhd
vsim work.testbench In summary, the HDL test bench file is scanned to identify all component instantiations (i.e. unit under test—UUT). The port definitions for these components are stored in a persistent data file or table. Next, the HDL net list file is read, and matching component names are found. Each port signal (of each component) is checked to see if it has changed from the HDL design file. If no change is detected (type remapping, signal add/drop), the process is complete (and the original test bench file will simulate without creation of a remap file). However, if a change is detected, then the present method creates a translation entity/module or remap file, which remaps the ports from the behavioral test bench file to the respective elements in the net list file, and the entity/module names (in the net list file) to avoid substantial changes to the behavioral test bench file.

Accordingly, when operating in the ISE flow, the operation of the present method can be automated and made transparent—and user HDL designs will always work at any level. When operating in a batch software environment with script or user created flows (e.g. using third party synthesis tools), a command line version of the method can be created, and by following a simple set of instructions, the user can make this flow automatic as well.

Thus, the present method automates the post-implementation simulation process and substantially reduces modification and hand recoding of the originally created test bench files. Accordingly, the originally created HDL test benches no longer need to be modified to simulate an HDL design after implementation. When operating in an ISE, post-behavioral test benches can be automatically remapped to simulate a HDL net list independent of the behavioral design's data types which allows post-behavioral testing to operate without any intervention of the user (such as data type translation from integer to std_logic_vector etc).

The testing process is greatly simplified for the user. There is no need to write or maintain multiple hand coded test benches (at each level). Rather, the user may create just an original behavioral test bench file to validate the design at all levels. Users with little or no experience in synthesis can easily validate their HDL designs without having to learn about synthesis transformation. Developers of large designs no longer have to worry about the synthesis translation problems in the test benches, reducing the amount of time spent developing.

While the present invention has been described herein above in connection with one or more embodiments, it is understood that this description was provided merely by way of example and that no limitation to the present invention was intended by such description. Rather, the present inven-

What is claimed is:

1. A method of post-implementation simulation of a hardware description language (HDL) net list file, that does not match a HDL design file from which it was synthesized, utilizing a (HDL) test bench file created for pre-implementation simulation of the HDL design file, said method comprising the steps of:
   creating a remap file which translates ports between the HDL net list file and the HDL design file; and
   simulating the HDL net list file utilizing the HDL test bench file and remap file.

2. The method according to claim 1 wherein the step of creating includes:
   creating a remap file which translates ports of the HDL net list file to ports of the HDL design file.

3. The method according to claim 1 wherein the step of creating includes:
   determining unmatched ports between the HDL net list file and the HDL design file; and
   creating routings in the remap file for translating said unmatched ports between the HDL net list file and the HDL design file.

4. The method according to claim 3 wherein the step of determining includes:
   building a first table of ports and corresponding port identifiers of the HDL design file;
   building a second table of ports and corresponding port identifiers of the HDL net list file; and
   comparing ports of said first table with ports of said second table to determine the unmatched ports based on said corresponding port identifiers.

5. The method according to claim 4 wherein the first and second tables are built with port identifiers comprising port names and port types.

6. The method according to claim 4 wherein the step of building a first table includes:
   scanning the HDL design file to identify component instantiations thereof;
   determining ports and corresponding port identifiers of said identified component instantiations;
   storing the determined ports and corresponding port identifiers in the first table.

7. The method according to claim 4 wherein the step of building a second table includes:
   scanning the HDL net list file to identify component instantiations thereof;
   determining ports and corresponding port identifiers of said identified component instantiations;
   storing the determined ports and corresponding port identifiers in the second table.

8. The method according to claim 1 wherein the step of creating includes:
   determining unmatched ports based on port names between the HDL net list file and the HDL design file; and
   creating a routing in the remap file for associating each of said unmatched ports as being one of the group consisting essentially of unconnected, open and defaulted.

9. The method according to claim 1 wherein the step of creating includes:
   determining unmatched ports based on port types between the HDL net list file and the HDL design file; and
   creating a routing in the remap file for associating each of said unmatched ports between the HDL net list file and the HDL design file utilizing a conversion routine.

10. The method according to claim 1 wherein the step of creating includes:
    determining matched ports between the HDL net list file and the HDL design file; and
    creating routings in the remap file for associating said matched ports directly between the HDL net list file and the HDL design file.

11. The method according to claim 1 wherein the steps are executed in an integrated software environment.

12. The method according to claim 1 wherein the steps are executed in a batch software environment.

13. A method of post-implementation simulation of a hardware description language (HDL) net list file, said method comprising executing the following steps in an integrated software environment:
    building the HDL net list file from a HDL design file;
    creating a remap file which translates ports between the HDL net list file and the HDL design file; and
    simulating the HDL net list file utilizing a (HDL) test bench file created for pre-implementation simulation of the HDL design file and the remap file.

14. The method according to claim 13 including the steps of:
    selecting a simulation flow for the HDL net list file; and
    building the HDL net list file based on the selected simulation flow.

15. The method according to claim 13 wherein the step of creating includes:
    creating a remap file which translates ports of the HDL net list file to ports of the HDL design file.

16. The method according to claim 13 wherein the step of creating includes:
    determining unmatched ports between the HDL net list file and the HDL design file; and
    creating routings in the remap file for translating said unmatched ports between the HDL net list file and the HDL design file.

17. The method according to claim 13 including creating the (HDL) test bench file for pre-implementation simulation of the HDL design file.

18. A method of post-implementation simulation of a hardware description language (HDL) net list file, said method comprising executing the following steps in a batch software environment:
    building the HDL net list file from a HDL design file;
    creating a remap file which translates ports between the HDL net list file and the HDL design file; and
    simulating the HDL net list file utilizing a (HDL) test bench file created for pre-implementation simulation of the HDL design file and the remap file.

19. The method according to claim 18 wherein the step of creating includes creating a remap file which translates ports of the HDL net list file to ports of the HDL design file.

20. The method according to claim 18 wherein the step of creating includes creating routings in the remap file for translating ports between the HDL net list file and the HDL design file.

* * * * *